US 9,192,959 B2

(12) United States Patent
Hong (10) Patent No.: US 9,192,959 B2
(45) Date of Patent: Nov. 24, 2015

(54) MASK FRAME ASSEMBLY FOR THIN FILM DEPOSITION

(71) Applicant: Samsung Display Co., Ltd., Yongin, Gyeonggi-do (KR)

(72) Inventor: Jeremy Hong, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/508,832

(22) Filed: Oct. 7, 2014

(65) Prior Publication Data

US 2015/0027367 A1 Jan. 29, 2015

Related U.S. Application Data

(63) Continuation of application No. 13/239,689, filed on Sep. 22, 2011, now Pat. No. 8,881,676.

(30) Foreign Application Priority Data

Apr. 25, 2011 (KR) ........................ 10-2011-0038438

(51) Int. Cl.
*B05C 21/00* (2006.01)
*H01L 51/56* (2006.01)
*C23C 14/04* (2006.01)
*C23C 14/12* (2006.01)

(52) U.S. Cl.
CPC .............. *B05C 21/005* (2013.01); *C23C 14/04* (2013.01); *C23C 14/042* (2013.01); *C23C 14/044* (2013.01); *C23C 14/12* (2013.01); *H01L 51/56* (2013.01)

(58) Field of Classification Search
None
See application file for complete search history.

(56) References Cited

U.S. PATENT DOCUMENTS

| 5,234,780 | A | * | 8/1993 | Nitayama et al. | 430/5 |
| 5,968,686 | A | * | 10/1999 | Yamada et al. | 430/5 |
| 6,858,086 | B2 | * | 2/2005 | Kang | 118/720 |
| 6,893,709 | B2 | * | 5/2005 | Kitazume | 428/192 |
| 7,572,338 | B2 | * | 8/2009 | Kim et al. | 118/720 |
| 7,704,326 | B2 | * | 4/2010 | Hagiwara et al. | 118/720 |
| 7,802,537 | B2 | * | 9/2010 | Kang | 118/504 |

(Continued)

FOREIGN PATENT DOCUMENTS

| JP | 2004055231 A | 2/2004 |
| JP | 201062125 A | 3/2010 |

(Continued)

OTHER PUBLICATIONS

Japanese Office Action issued by Japanese Patent Office on Jun. 23, 2015 in corresponding Japanese Patent Application No. 2011252565 and Request for Entry of the Accompanying Office Action attached herewith.

*Primary Examiner* — Dah-Wei D Yuan
*Assistant Examiner* — Jethro M Pence
(74) *Attorney, Agent, or Firm* — Robert E. Bushnell, Esq.

(57) ABSTRACT

A mask frame assembly for depositing a deposition material on a deposition substrate comprises a mask frame including an opening and frames surrounding the opening, and a mask coupled on the mask frame. A deformation prevention unit is formed on at least one region of the mask. Since the deformation prevention unit is formed on a peripheral portion of a deposition pattern in the mask, deformation of the mask in a vertical direction may be reduced. Accordingly, defective attaching of the mask to the substrate may be reduced.

10 Claims, 7 Drawing Sheets

(56) References Cited

U.S. PATENT DOCUMENTS

| | | |
|---|---|---|
| 7,837,528 B2 * | 11/2010 | Shigemura et al. ............. 445/24 |
| 8,286,579 B2 * | 10/2012 | Sung et al. .................... 118/504 |
| 2001/0004469 A1 * | 6/2001 | Himeshima et al. ............ 427/66 |
| 2003/0101932 A1 | 6/2003 | Kang |
| 2004/0104197 A1 * | 6/2004 | Shigemura et al. ............. 216/20 |
| 2005/0264177 A1 * | 12/2005 | Chung et al. .................. 313/503 |
| 2006/0011136 A1 * | 1/2006 | Yamazaki et al. ............ 118/719 |
| 2006/0103289 A1 * | 5/2006 | Kim et al. ..................... 313/402 |
| 2008/0018236 A1 * | 1/2008 | Arai et al. ..................... 313/504 |
| 2009/0137180 A1 * | 5/2009 | Sung et al. ...................... 445/60 |
| 2010/0055810 A1 * | 3/2010 | Sung et al. ...................... 438/22 |
| 2010/0192856 A1 * | 8/2010 | Sung et al. .................... 118/721 |
| 2010/0267227 A1 * | 10/2010 | Ko et al. ........................ 438/597 |
| 2011/0067630 A1 * | 3/2011 | Ko et al. ........................ 118/721 |
| 2011/0229633 A1 | 9/2011 | Hong et al. |

FOREIGN PATENT DOCUMENTS

| | | |
|---|---|---|
| KR | 10-0490534 | 5/2005 |
| KR | 10-2006-0055619 | 5/2006 |
| KR | 10-2009-0059225 | 6/2009 |
| KR | 10-2010-0090070 | 8/2010 |
| KR | 10-2011-0104793 | 9/2011 |

* cited by examiner

MASK FRAME ASSEMBLY FOR THIN FILM DEPOSITION

CLAIM OF PRIORITY

This application is a continuation of Applicant's Ser. No. 13/239,689 entitled MASK FRAME ASSEMBLY FOR THIN FILM DEPOSITION filed in the U.S. Patent & Trademark Office on Sep. 22, 2011 and assigned to the assignee of the above-captioned application. Further, this application makes reference to, incorporates the same herein, and claims all benefits accruing under 35 U.S.C. §119, §120 and/or §121 from the aforesaid Applicant's Ser. No. 13/239,689 and from an application earlier filed in the Korean Intellectual Property Office on Apr. 25, 2011 and there duly assigned Serial No. 10-2011-0038438.

BACKGROUND OF THE INVENTION

1. Field of the Invention

The present invention relates to a mask frame assembly for thin film deposition, and more particularly, to a mask frame assembly for thin film deposition which prevents a mask from deforming.

2. Description of the Related Art

In general, organic light emitting display devices (OLEDs) including a thin film transistor (TFT) may be used in display devices in mobile appliances such as digital cameras, video cameras, portable information terminals, smart phones, tablet computers, or ultra-thin laptop computers, and electronic devices such as ultra-thin televisions.

An OLED emits lights of different colors when holes and electrons injected into an anode and a cathode recombine in an organic emission layer. The OLED is a stack type display device in which the organic emission layer is inserted between the anode and the cathode.

However, according to the above-described structure, highly efficient light emission may not be performed, and thus, intermediate layers such as an electron injection layer, an electron transport layer, a hole transport layer, and a hole injection layer are selectively inserted between the electrodes and the organic emission layer.

The electrodes and the intermediate layers, including the organic emission layer of the OLED, may be formed via a photolithography method or a deposition method.

SUMMARY OF THE INVENTION

The present invention provides a mask frame assembly for a thin film deposition which may reduce deformation of a mask, and thus, defects during attachment of the mask to a substrate may be reduced.

According to an aspect of the present invention, a mask frame assembly for a thin film deposition comprises: a mask frame including an opening and frames surrounding the opening; and a mask coupled on the mask frame; wherein a deformation prevention unit is formed on at least one region of the mask.

The mask may include a plurality of deposition patterns which are separated from each other in a length direction of the mask, and ribs between adjacent deposition patterns to connect the deposition patterns to each other, and the deformation prevention unit may be a first dummy pattern formed on each of the ribs.

The mask may further include a plurality of second dummy patterns formed on opposite edges of the deposition patterns in a width direction of the deposition patterns.

The deposition pattern, the first dummy pattern, and the second dummy pattern may be formed as a dot type slit pattern or a striped slit pattern.

The mask may further include half-etched portions formed on the opposite edges of the deposition pattern in the width direction of the deposition pattern.

The half-etched portion may be formed by etching the mask so as to have a thickness less than other portions of the mask from a second surface which is opposite a first surface facing a deposition substrate.

The first surface may be a surface contacting the deposition substrate which is to be patterned.

The mask may include a plurality of deposition patterns which are separated from each other in a length direction of the mask, and ribs disposed between adjacent deposition patterns so as to connect the deposition patterns to each other, and the deformation prevention unit may be a first half-etched portion formed on each of the ribs.

The first portion may extend from both sides of the rib toward edges of the mask.

Opposite end portions of the mask may be welded to the frames which are arranged to face each other in a state where a tensile force is applied to the frames.

The mask frame may include: a plurality of first frames arranged so as to face each other in a direction; and a plurality of second frames arranged so as to face each other in another direction; wherein the plurality of first frames and the plurality of second frames may be connected to each other so as to surround the opening.

The mask may be disposed in parallel with the plurality of first frames, and is arranged successively relative to the plurality of second frames.

The mask may include at least one partition mask which is disposed in a direction so as to cross the opening of the mask frame.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The invention will now be described more fully with reference to the accompanying drawings, in which illustrative embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms "first" and "second" are used herein to describe various elements, these elements should not be limited by these terms. These terms are only used to distinguish one element from another element. Thus, a first element discussed below could be termed a second element, and similarly, a second element may be termed a first element, without departing from the teachings of this disclosure. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, a mask frame assembly for thin film deposition according to embodiments of the present invention will be described with reference to accompanying drawings.

A photolithography method used to form a general organic light emitting display device (OLED) is a wet etching method in which a photoresist is applied to a part of a substrate. However, in the photolithography method, humidity may infiltrate into an organic emission layer when the photoresist is isolated from the substrate. Accordingly, the characteristics, such as the lifespan of the OLED, may greatly degrade.

One of the methods for solving the above problem of the photolithography method is a deposition method. In the deposition method, a fine metal mask (FMM) having a pattern which is the same as a pattern of a thin film to be formed on a substrate is aligned on the substrate, and a raw material for forming the thin film is deposited on the substrate in a desired pattern.

As a deposition mask, a large-sized mask coupled to a mask frame is used. A thin film pattern corresponding to an entire surface of the substrate is formed on the large-sized mask. However, if the FMM becomes large, an etching error for forming the pattern also increases. Accordingly, image quality is degraded.

Recently, a partition mask formed by dividing a mask into a plurality of sticks and attaching the sticks to a mask frame has been used. When the partition mask is attached to the mask frame, the partition mask is welded to the mask frame in a state of extending in a length direction thereof.

However, even when the partition mask is used, a defect in the image quality caused by defective deposition may be generated at a peripheral portion of the deposition pattern. The main reason for this problem may be a defective attachment of the mask with respect to the substrate.

That is, when the partition mask is extended in the length direction of the substrate, a plurality of deposition patterns sag on the substrate, and then, peripheral portions of the deposition patterns, that is, ribs which correspond to regions between two adjacent deposition patterns, bend outward. Therefore, the attachment of the mask to the substrate may not be performed sufficiently. Thus, the deformation of the mask needs to be minimized.

Figure 1:
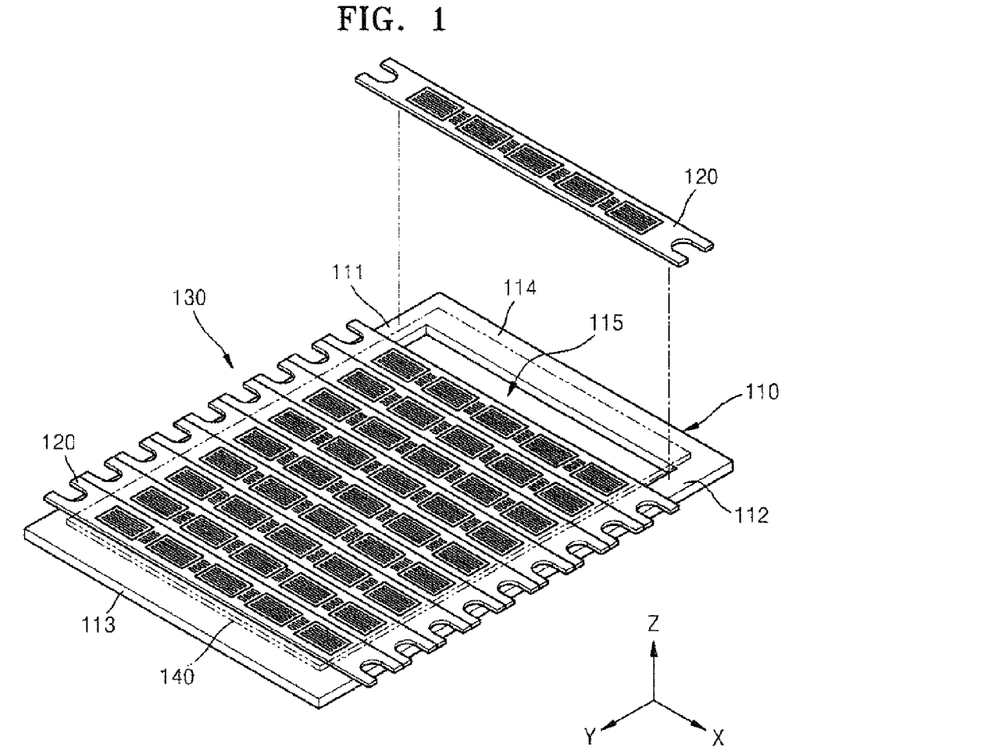
FIG. 1 is a perspective view of a mask frame assembly for a thin film deposition according to an embodiment of the present invention.
Figure 2:
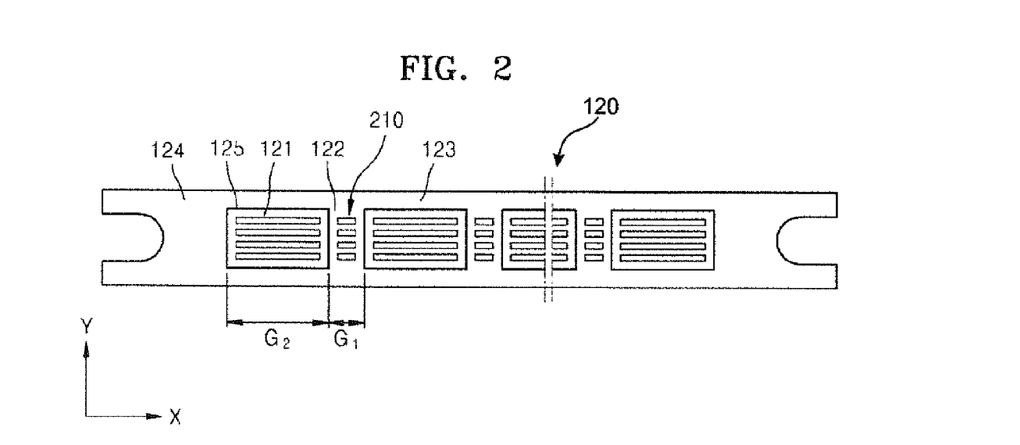
FIG. 2 is a plan view of a partition mask shown in FIG. 1.

FIG. 1 is a perspective view of a mask frame assembly for thin film deposition according to an embodiment of the present invention, and FIG. 2 is a plan view of a partition mask shown in FIG. 1.

Referring to FIGS. 1 and 2, the mask frame assembly 100 includes a mask frame 110 and a mask 130. The mask 130 includes a plurality of partition masks 120.

An opening 115 is formed in the mask frame 110, and a plurality of frames 111 thru 114 are connected to each other so as to surround the opening 115.

The frames 111 thru 114 include a first frame 111 and a second frame 112 facing each other in an X-axis direction and arranged in parallel with each other in a Y-axis direction, and a third frame 113 and a fourth frame 114 facing each other in the Y-axis direction and arranged in parallel with each other in the X-axis direction. The first thru fourth frames 111 thru 114, respectively, are connected to each other so as to form a square frame.

On the other hand, the mask frame 110 may be formed of a material which deforms less during welding of the partition masks 120, for example, a metal having high rigidity.

The mask 130 is coupled to the mask frame 110. In order to perform a patterning operation with high precision by using the mask 130, a shadow needs to be reduced by increasing an attachment degree between the mask 130 and a substrate 140 located on the mask 130. Therefore, the mask 130 may be formed as a thin plate. The mask 130 may be formed of stainless steel, Invar, nickel (Ni), cobalt (Co), a Ni alloy, and a Ni—Co alloy.

The mask 130 may include a plurality of partition masks 120 which are separate from each other in the Y-axis direction in order to prevent the mask 130 from sagging due to self-weight. In the present embodiment, as described, the partition masks 120 are formed as stripes. However, the present invention is not limited thereto. That is, a mask having a width less than a length in which the mask is extended may be used.

The partition masks 120 are divided along the Y-axis direction which is perpendicular to the X-axis direction, and in which the partition masks 120 are extended. That is, both ends of each of the partition masks 120 are fixed on the first frame 111 and the second frame 112, and the partition masks 120 are successively arranged in the Y-axis direction so as to cover the opening 115.

A deformation prevention unit is formed on at least a region in each of the partition masks 120 for preventing the partition mask 120 from deforming due to contact with the deposition substrate 140.

This will be described in more detail as follows.

Further referring to FIGS. 1 and 2, each of the partition masks 120 is a metal plate formed as a stripe. Deposition areas 125, on which a plurality of deposition patterns 121 separated from each other in the length direction of the partition mask 120 are formed, are provided on the partition mask 120. The deposition patterns 121 include a plurality of slits. The patterns formed in the deposition patterns 121 are not limited to the slits and, for example, may be formed as dots.

The deposition pattern 121 may be formed via an electro forming method so that the fine patterning operation may be performed and a surface flatness may be obtained. Otherwise, the deposition pattern 121 may be fabricated by an etching method or a laser processing method. When the deposition pattern 121 is fabricated by the etching method, the deposition pattern 121 may be formed by forming a resist layer having the same pattern as that of the deposition pattern 121 on a thin plate by using a photoresist or by etching the thin plate after attaching a film having the pattern on the thin plate.

A rib 122 is formed between two adjacent deposition patterns 121 so as to connect the plurality of deposition areas 125 to each other. The rib 122 is formed between the deposition areas 125 in the X-axis direction in which the partition mask 120 is extended. Circumferential portions 123 are formed on both edges of the partition mask 120 in a width direction thereof. Welding portions 124 are formed on both end portions of the partition mask 120.

The partition masks 120 are arranged in the X-axis direction so as to cross the opening 115. The welding portions 124 of each of the partition masks 120 are welded onto the first frame 111 and the second frame 112 when a predetermined tensile force is applied to the partition mask 120 in the X-axis direction. Accordingly, the mask 130 is fixed on the mask frame 110.

A deformation prevention portion is formed on the rib 122. The deformation prevention portion corresponds to a dummy pattern 210 formed on the rib 122. A gap $G_1$ disposed between the dummy patterns 210 in the length direction (that is, the Y-axis direction) is narrower than a gap $G_2$ disposed between the deposition patterns 121 in the length direction. The gap $G_1$ of the dummy patterns 210 is narrower than the gap $G_2$ in order to ensure development of a display area of a desired size by increasing the deposition areas 125 on which the deposition patterns 121 are formed.

It is advantageous that the dummy pattern 210 has the same pattern as that of the deposition pattern 121 when fabricating the mask 130. Accordingly, the dummy pattern 210 may be a striped slit pattern or a dot type slit pattern. However, the present invention is not limited thereto, and the dummy pattern 210 may have various shapes.

On the other hand, if a deposition on the deposition substrate 140 of the pattern corresponding to the dummy pattern 210 is not desired, the dummy pattern 210 may be blocked by using a blocking mask during the deposition.

According to experiments conducted by the present applicant, when a conventional mask frame assembly on which the dummy pattern was not formed was used, and when the partition mask was fixed on the mask frame in a state where a predetermined tensile force was applied to the partition mask, the rib bulged by about 10 μm from the deposition area toward the deposition substrate due to sagging of the deposition area in which the deposition pattern was formed.

On the other hand, when the mask 130 having the partition masks 120 is used as in the present embodiment, the deposition areas on which the deposition patterns 121 are formed and the ribs 122 on which the dummy patterns 210 are formed are equally deformed. Therefore, the ribs 122 on which the dummy patterns 210 are formed do not bulge toward the deposition substrate 140, and are maintained at the same level as the deposition patterns 121.

Therefore, the flatness of the partition mask 120 may be improved, and the defective contact of the mask 130 with the deposition substrate 140 may be prevented. Accordingly, location accuracy of the pattern may be improved, and the deposition quality is also improved.

Figure 3:
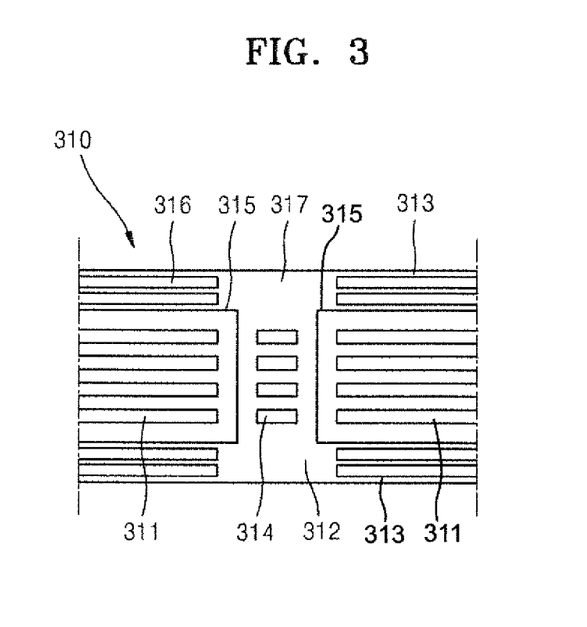
FIG. 3 is a plan view partially showing a modified example of the partition mask of FIG. 2.

FIG. 3 is a plan view showing a modified example of the partition mask of FIG. 2.

Referring to FIG. 3, deposition areas 315 in which a plurality of deposition patterns 311 are formed are formed in a partition mask 310 in a length direction of the partition mask 310. The deposition patterns 311 include a plurality of striped slits.

A rib 312 is formed between two adjacent deposition patterns 311 so as to connect the plurality of deposition areas 315 to each other. The rib 312 is formed between the deposition areas 315 along a direction in which the partition mask 310 is extended. Circumferential portions 313 are formed on both edges of the partition mask 310 in a width direction thereof.

A deformation prevention unit is formed on a peripheral portion of the deposition area in which the deposition pattern 311 is formed. The deformation prevention unit includes a first dummy pattern 314 formed on the rib 312, and a second dummy patterns 316 formed on the circumferential portions 313.

A length of the first dummy pattern 314 is less than that of the deposition pattern 311, like the dummy pattern 122 shown in FIG. 2, and the first dummy pattern 314 has substantially the same shape as the deposition pattern 311.

The second dummy pattern 316 may be a striped slit pattern or a dot type slit pattern formed on the circumferential portion 313.

The second dummy pattern 316 may be formed so as to extend along the edges of the partition mask 310, or it may be formed on the edges of the deposition area 315 except for the edges 317 of the partition mask 310, which extend from the rib 312 in the width direction of the partition mask 310, because a welding operation may be performed on the portions 317 extending from the rib 312 toward the edges of the partition mask 310 when another member, such as a supporting board, may be installed.

Figure 4:
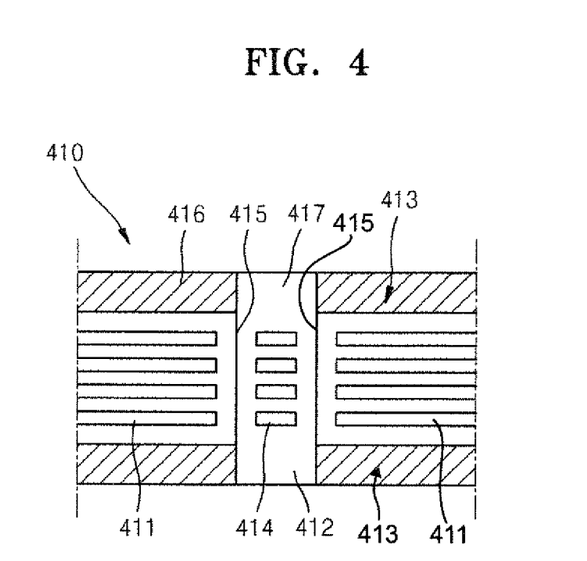
FIG. 4 is a plan view partially showing another modified example of the partition mask of FIG. 2.

FIG. 4 is a plan view partially showing another modified example of the partition mask of FIG. 2.

Referring to FIG. 4, deposition areas 415, in which a plurality of deposition patterns 411 are formed, are formed on a partition mask 410 in a length direction of the partition mask 410. A rib 412 is formed between two adjacent deposition patterns 411 so as to connect the deposition areas 415 to each other. Circumferential portions 413 are formed on both edges of the partition mask 410 in a width direction of the partition mask 410.

Deformation prevention units are formed on peripheral portions of the deposition areas 415 in which the deposition patterns 411 are formed. Each of the deformation prevention units includes a dummy pattern 414 formed on the rib 412, and half-etched portions 416 formed on the peripheral portions 413.

The length of the dummy pattern 414 is less than that of the deposition pattern 411 as described above, and the dummy pattern 414 may have substantially the same shape as the deposition pattern 411.

The half-etched portions 416 are formed on the peripheral portions 413, and the thickness of a portion where the half-etched portion 416 is formed is less than that of other portion in the partition mask 410. A surface on which the half-etched portion 416 is etched is opposite a surface which the deposition substrate (140 of FIG. 1) to be patterned contacts. The half-etched portion 416 will be described in more detail later.

When the partition mask 410 having the above structure is used, a deformation (that is, bulging of the dummy pattern 414 formed on the rib 412 toward the deposition substrate 140 when compared to the deposition area 415 in which the deposition pattern 411 is formed) may be reduced. Thus, the surface flatness of the mask 410 may be maintained. At the same time, the half-etched portion 416 formed on the circumferential portion 413 may additionally prevent the deformation of the mask 410.

Figure 5:
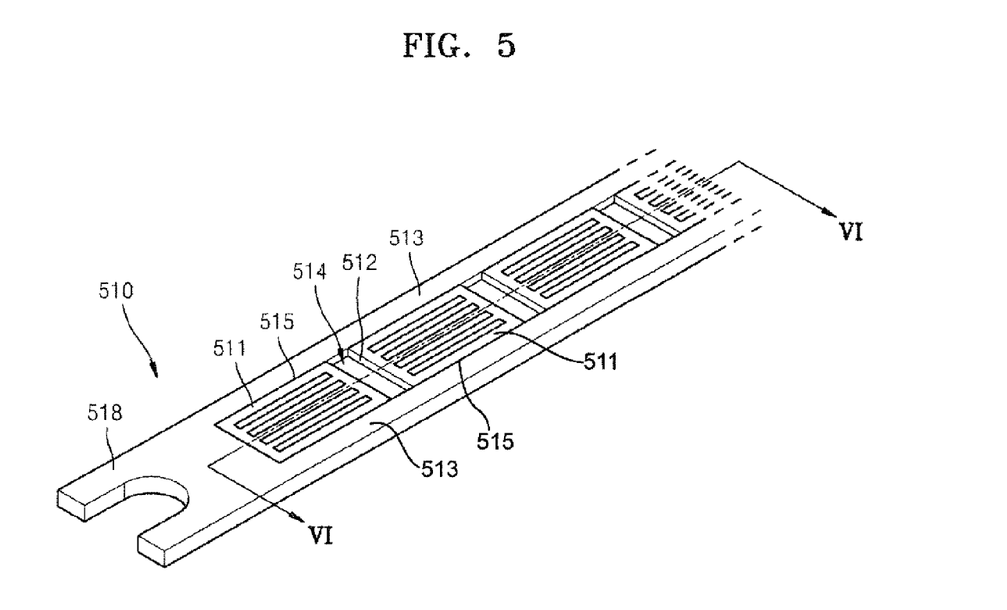
FIG. 5 is a partially cut perspective view of a partition mask according to another embodiment of the present invention.
Figure 6:
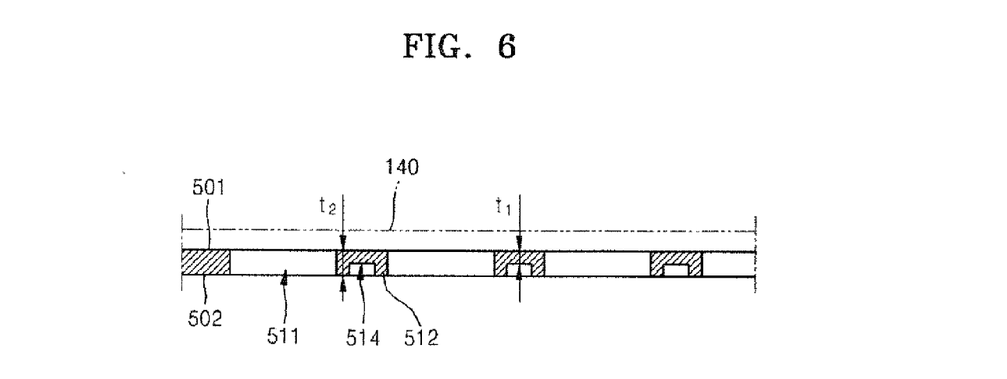
FIG. 6 is a cross-sectional view of the partition mask taken along a line VI-VI of FIG. 5.

FIG. 5 is a partially cut perspective view of a partition mask according to another embodiment of the present invention, and FIG. 6 is a cross-sectional view of the partition mask taken along a line VI-VI of FIG. 5.

Referring to FIGS. 5 and 6, the partition mask 510 includes deposition areas 515, on which a plurality of deposition patterns 511 are formed. The deposition areas 515 are separated from each other in a length direction of the partition mask 510. A plurality of striped slits are formed in each of the deposition patterns 511.

A rib 512 is formed between two adjacent deposition areas 515 so as to connect the deposition areas 515 to each other. The rib 512 is formed between the deposition areas 515 in a direction in which the partition mask 510 is extended. Circumferential portions 513 are formed on both edges of the partition mask 510 in a width direction of the partition mask 510. A welding portion 518 is formed on an end portion of the partition mask 510.

Deformation prevention units are formed on peripheral portions of the deposition areas 515. Each of the deformation prevention units corresponds to a half-etched portion 514 formed on the rib 512. The half-etched portion 514 is formed by half-etching a portion, on which the rib 512 is formed, from a second surface 502 which is opposite a first surface 501, on which the deposition substrate 140 is mounted. The thickness t1 of the half-etched portion 514 may be half the thickness t2 of another portion in the partition mask 510.

According to experimental results obtained by the present applicant, when a conventional mask frame assembly, in which the dummy pattern was not formed, was used, sagging of the deposition area on which the deposition pattern was formed occurred when the partition mask was fixed on the mask frame in a state where a predetermined tensile force was applied to the partition mask. Thus, the rib bulged by about 10 μm relative to the deposition area toward the deposition substrate.

On the other hand, when the partition mask 510 of the present embodiment is used, the portion in the rib 512, on which the half-etched portion 514 is formed, sagged by about 3 μm less than the deposition area 515 on which the deposition pattern 511 is formed.

As described above, since the substrate 140 is attached to the deposition area 515, a surface contact of the deposition area 515 to the substrate 140 may occur, and thus, the deposition quality may be improved. Conversely, the rib 512, on which the deposition is not performed, may be separated from the substrate 140. However, since the deposition is not performed on the rib 512, the separation between the rib 512 and the substrate 140 does not affect the deposition quality.

Figure 7:
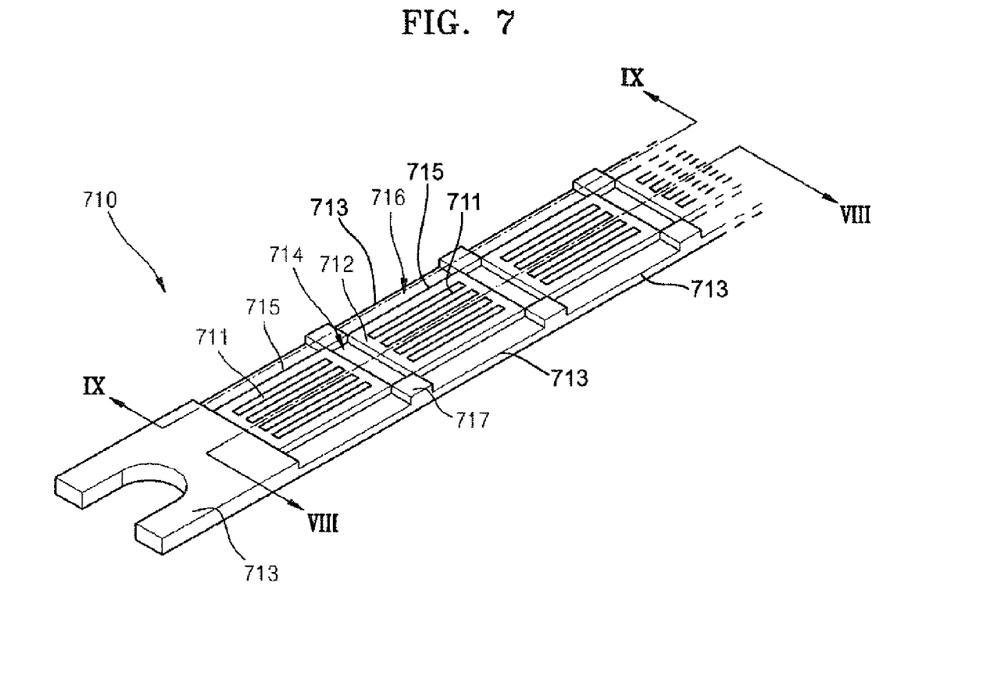
FIG. 7 is a partially cut perspective view of a partition mask according to another embodiment of the present invention.
Figure 8:
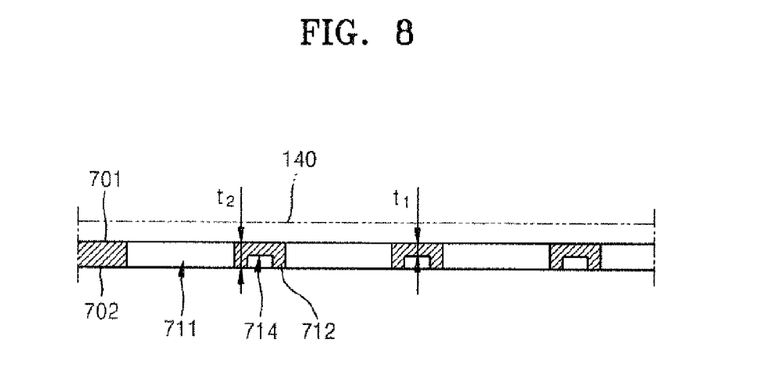
FIG. 8 is a cross-sectional view of the partition mask taken along a line VIII-VIII of FIG. 7.
Figure 9:
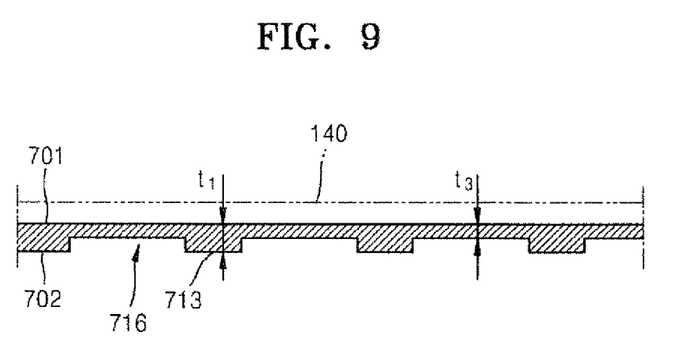
FIG. 9 is a cross-sectional view of the partition mask taken along line IX-IX of FIG. 7.

FIG. 7 is a partially cut perspective view of a partition mask according to another embodiment of the present invention, FIG. 8 is a cross-sectional view of the partition mask taken along a line VIII-VIII of FIG. 7, and FIG. 9 is a cross-sectional view of the partition mask taken along line IX-IX of FIG. 7.

Referring to FIGS. 7 thru 9, the partition mask 710 includes deposition areas 715 on which a plurality of deposition patterns 711 are formed in a length direction of the partition direction 710. Each of the deposition patterns 711 includes a plurality of striped slits.

A rib 712 is formed between two adjacent deposition areas 715 so as to connect the deposition areas 715 to each other. Circumferential portions 713 are formed on both edges of the partition mask 710 in a width direction of the partition mask 710.

Deformation prevention units are formed on the circumferential portions of the deposition areas 715. Each of the deformation prevention units includes a first half-etched portion 714 formed on the rib 712, and a second half-etched portion 716 formed on the circumferential portion 713.

The first half-etched portion 714 is formed by half-etched the portion where the rib 712 is formed from a second surface 702 which is opposite a first surface 701, on which the deposition substrate 140 is mounted, like the half-etched portion 514 of FIG. 5. The thickness t1 of the first half-etched portion 714 is about half the thickness t2 of another portion of the partition mask 710.

The second half-etched portion 716 is formed on both edges of the deposition area 715. Like the first half-etched portion 714, the second half-etched portion 716 is formed by half-etched the circumferential portions 713 from the second surface 702. The thickness t3 of the second half-etched portion 716 is about half the thickness t1 of the portion, which is not half-etched, in the partition mask 710.

On the other hand, portions 717 extending from the rib 712, on which the first half-etched portion 714 is formed, toward both edges of the partition mask 710 are not half-etched because a welding process is performed on the portions 717 when another member, such as a supporting board, is installed.

According to experimental results obtained by the present applicant, when a conventional mask frame assembly, in which the dummy pattern was not formed, was used, the sagging of the deposition area on which the deposition pattern was formed occurred when the partition mask was fixed on the mask frame in a state where a predetermined tensile force was applied to the partition mask. Thus, the rib bulged by about 10 μm relative to the deposition area toward the deposition substrate.

However, when the partition mask 710 of the present embodiment is used, the portion in the rib 712, on which the half-etched portion 714 is formed, and the portion in the circumferential portion 713, on which the second half-etched portion 716 is formed, sagged by about 1.5 μm less than the deposition area 715 on which the deposition pattern 711 is formed.

Therefore, the adhering force of the deposition substrate 140 with respect to the deposition area 715 is improved, thereby improving the deposition quality.

Figure 10:
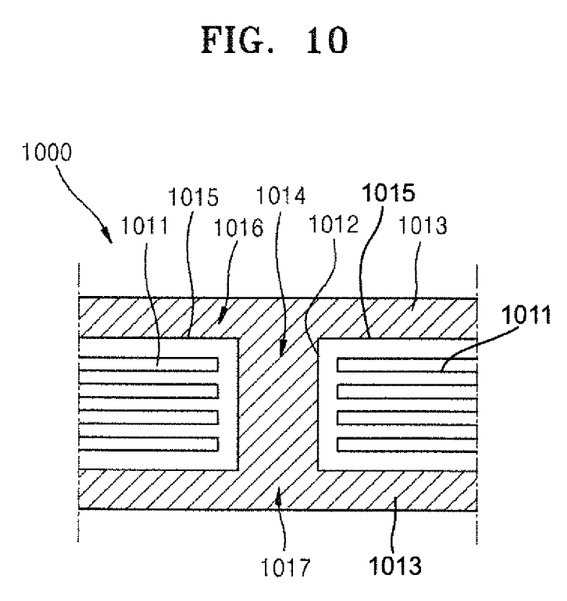
FIG. 10 is a plan view partially showing a partition mask according to another embodiment of the present invention.

FIG. 10 is a plan view partially showing a partition mask according to another embodiment of the present invention. That is, FIG. 10 is a modified example of the partition mask 710 of FIG. 7.

Referring to FIG. 10, on a partition mask 1000, deposition areas 1015 on which a plurality of deposition patterns 1011 are formed are disposed on the partition mask 1000 in a length direction of the partition mask 1000. A rib 1012 is formed between two adjacent patterns 1011, and circumferential portions 1013 are formed on both edges of the partition mask 1000 in a width direction of the partition mask 1000.

A deformation prevention unit is formed on the peripheral portion of the deposition area 1015 on which the deposition pattern 1011 is formed. The deformation prevention unit may include a first half-etched portion 1014 formed on the rib 1012, second half-etched portions 1016 formed on both edges of the deposition area 1015, and third half-etched portions 1017 formed on portions extending from the rib 1012 to both edges of the partition mask 1000.

Unlike the partition mask 710 of FIG. 7, the portions 1017 extending from the rib 1012 toward both edges of the partition mask 1000 are also half-etched. Accordingly, the half-etched portions surround the deposition area 1015 on which the deposition pattern 1011 is formed.

Figure 11:
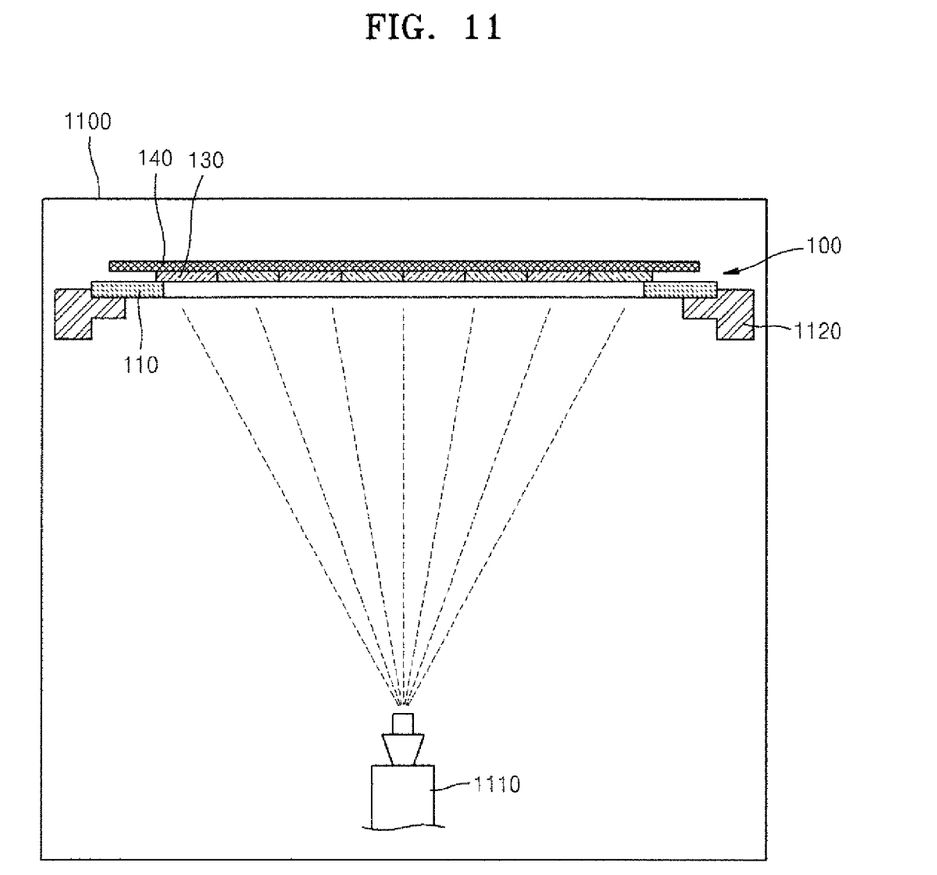
FIG. 11 is a block diagram showing a deposition state using a mask frame assembly according to an embodiment of the present invention.

FIG. 11 is a block diagram showing a deposition process using a mask frame assembly according to an embodiment of the present invention.

Referring to FIG. 11, a vacuum chamber 1100 is prepared in order to form an organic emission layer or electrodes in an OLED by using the mask frame assembly 100.

A deposition source 1110 is located on a lower portion of the vacuum chamber 1100, and the mask frame assembly 100 is installed on an upper portion of the deposition source 1110. The deposition substrate 140 is located on an upper portion of the mask 130. Additional supporting members 1120 may be formed on edges of the mask frame assembly 100 for fixing the mask frame assembly 100.

Processes of depositing a deposition material on a desired position of the substrate 140 will be described as follows.

First, the mask frame assembly 100 is fixed on the supporting members 1120, and the deposition substrate 140 is located above the mask 130.

Then, when the deposition material is sprayed from the deposition source 1110, located on the lower portion of the vacuum chamber 1100, toward the mask frame assembly 100, the deposition material is deposited on a surface of the deposition substrate 140 in a desired pattern (corresponding to the deposition patterns 121 of FIG. 2) formed on the mask 130.

Since the dummy patterns 210, which are the deformation prevention units, are formed on the ribs 122 between the deposition areas 125, on which the deposition patterns 121 are formed, in each of the partition masks 120 of the mask 130, the deposition areas 125 may be completely attached to the deposition substrate 140, and thus deposition quality may be improved.

Figure 12:
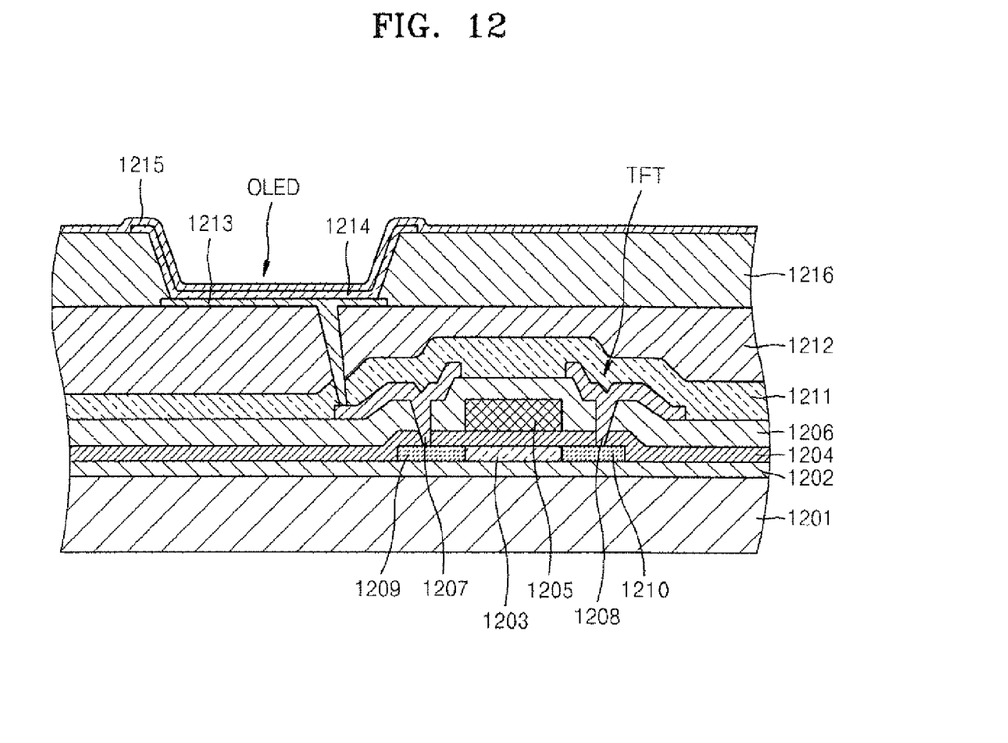
FIG. 12 is a cross-sectional view of an organic light emitting display device (OLED) deposited by using the mask frame assembly according to the embodiment of the present invention.

FIG. 12 is a cross-section view of an organic light-emitting display device (OLED) deposited by using the mask frame assembly according to the embodiment of the present invention.

The sub-pixel includes at least one thin film transistor (TFT) and an OLED. The structure of the TFT is not limited to the example shown in FIG. 12, and the number and structure of the TFTs may be variously modified.

Referring to FIG. 12, a buffer layer 1202 is formed on a substrate 1201. The substrate 1201 is formed of a glass material or a plastic material. A semiconductor active layer 1203 having a predetermined pattern is formed on the buffer layer 1202. A gate insulating layer 1204 is formed on the semiconductor active layer 1203, and a gate electrode 1205 is formed on a predetermined region of the gate insulating layer 1204.

The gate electrode 1205 is connected to a gate line (not shown) which applies turning-on/turning-off signals of the TFT. An interlayer dielectric 1206 is formed on the gate electrode 1205, and a source electrode 1207 and a drain electrode 1208 are formed so as to contact a source region 1209 and a drain region 1210, respectively, of the semiconductor active layer 1203 through contact holes.

A passivation layer 1211 composed of $SiO_2$ or $SiN_x$ is formed on the source electrode 1207 and the drain electrode 1208. A planarization layer 1212, which is composed of an organic material such as acryl, polyimide, or benzocyclobutene (BCB), is formed on the passivation layer 1211.

A pixel electrode 1213, that is, an anode of the organic light-emitting display device, is formed on the planarization layer 1212, and a pixel define layer (PDL) 1216 is formed of an organic material so as to cover the pixel electrode 1213. A predetermined opening is formed in the PDL 1216, and then, an organic layer 1214 is formed on an upper portion of the PDL 1216 and on an upper portion of the pixel electrode 1213, which is exposed to the outside through the opening formed in the PDL 1216. The organic layer 1214 includes an emission layer. The present invention is not limited to the above described structure, and other structures may be used.

The OLED displays predetermined image information by emitting red, green, and blue lights according to the flow of an electric current. The OLED includes the pixel electrode 1213 which is a first electrode connected to the source electrode 1208 of the TFT for receiving a positive voltage, an opposite electrode 1215 which is a second electrode formed to cover entire pixels and supplying a negative voltage, and the organic layer 1214 disposed between the pixel electrode 1213 and the opposite electrode 1215 so as to emit light.

The pixel electrode 1213 and the opposite electrode 1215 are insulated from each other by the organic layer 1214, and they apply voltages of opposite polarities to the organic layer 1214 so that the organic layer 1214 emits the light.

The pixel electrode 1213 operates as an anode, and the opposite electrode 1215 operates as a cathode. Polarities of the pixel electrode 1213 and the opposite electrode 1215 may be reversed.

The pixel electrode 1213 may be formed as a transparent electrode or a reflective electrode.

Such a transparent electrode may be formed of indium tin oxide (ITO), indium zinc oxide (IZO), zinc oxide (ZnO), or indium oxide ($In_2O_3$). Such a reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof, and by forming a layer of ITO, IZO, ZnO, or $In_2O_3$ on the reflective layer.

The opposite electrode 1215 may be also formed as a transparent electrode or a reflective electrode.

When the opposite electrode 1215 is a transparent electrode, the opposite electrode 1215 functions as a cathode. To this end, the transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof, on a surface of the organic layer 1214, and by forming an auxiliary electrode layer or a bus electrode line thereon from a transparent electrode forming material, such as ITO, IZO, ZnO, $In_2O_3$, or the like. When the opposite electrode 1214 is a reflective electrode, the reflective layer may be formed by depositing Li, Ca, LiF/Ca, LiF/Al, Al, Ag, Mg, or a compound thereof on the entire surface of the organic layer 1214.

On the other hand, the pixel electrode 1213 which is formed as the transparent or reflective electrode may be formed so as to correspond to the opening of each of the sub-pixels. In addition, the opposite electrode 1215 may be formed by entirely forming the transparent or the reflective electrode on the display area. However, the opposite electrode 1215 may not be entirely formed on the display area, and may be formed in various patterns. Locations of the pixel electrode 1213 and the opposite electrode 1215 may be reversed.

The organic layer 1214 may include a low-molecular weight organic layer or a high-molecular weight organic material.

When a low-molecular weight organic layer is used, the organic layer 1214 may have a single or multi-layer structure, including at least one selected from the group consisting of a hole injection layer (HIL), a hole transport layer (HTL), an emission layer (EML), an electron transport layer (ETL), and an electron injection layer (EIL). Examples of available organic materials include copper phthalocyanine (CuPc), N,N'-di(naphthalene-1-yl)-N,N'-diphenyl-benzidine (NPB), tris-8-hydroxyquinoline aluminum (Alq3), and the like. The low-molecular weight organic layer may be formed by vacuum deposition.

When a high-molecular weight organic layer is used, the organic layer 1214 may mostly have a structure including a HTL and an EML. In this case, the HTL may be formed of poly(ethylenedioxythiophene) (PEDOT), and the EML may be formed of polyphenylenevinylenes (PPVs) or polyfluorenes. The HTL and the EML may be formed by screen printing, inkjet printing, or the like.

The organic layer 1214 is not limited to the above example, and may be modified variously.

According to the mask frame assembly for the thin film deposition of the embodiments of the present invention, the following advantages may be obtained.

Since the deformation prevention units are formed on the peripheral portions of the deposition patterns in the mask, deformation of the mask in a vertical direction may be reduced. Accordingly, defective attaching of the mask to the substrate may be reduced.

In addition, since the attaching of the mask to the substrate may be improved, the deposition quality is improved. Thus, the image quality may be improved.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A mask frame assembly for a thin film deposition, the mask frame assembly comprising:
    a mask frame including an opening and frames surrounding the opening; and
    a mask coupled to the mask frame, the mask comprising:
    a plurality of deposition patterns which are separated from each other; and
    a rib disposed between immediately adjacent deposition patterns and connecting the deposition patterns to each other, the rib comprising a first half-etched portion that is recessed from a surface of the rib and does not penetrate through the mask, the first half-etched portion of the rib having a rectangular shape and being enclosed by four sidewalls and a bottom wall of the rib, a thickness of the first half-etched portion being less than a thickness of another portion of the mask.

2. The mask frame assembly of claim 1, wherein the first half-etched portion extends toward edges of the mask.

3. The mask frame assembly of claim 2, wherein the first half-etched portion is formed by etching a second surface of the mask so as to have a thickness less than other portions of the mask, a first surface of the mask facing a deposition substrate and the second surface being an opposite the first surface.

4. The mask frame assembly of claim 1, wherein the mask further comprises second half-etched portions disposed on opposite edges of the deposition patterns in a width direction of the deposition pattern.

5. The mask frame assembly of claim 4, wherein the first half-etching portion and the second half-etched portions are formed by etching a second surface of the mask so as to have a thickness less than other portions of the mask, a first surface of the mask facing a deposition substrate and the second surface being opposite the first surface.

6. The mask frame assembly of claim 5, wherein the first surface is a surface contacting the deposition substrate which is to be patterned.

7. The mask frame assembly of claim 1, wherein opposite end portions of the mask are welded to frames which are arranged to face each other in a state where a tensile force is applied to the frames.

8. The mask frame assembly of claim 1, wherein the mask frame comprises:
    a plurality of first frames arranged so as to face each other in a first direction; and
    a plurality of second frames arranged so as to face each other in a second direction;
    wherein the plurality of first frames and the plurality of second frames are connected to each other so as to surround the opening of the mask frame.

9. The mask frame assembly of claim 8, wherein the mask is disposed in parallel with the plurality of first frames, and is arranged successively relative to the plurality of second frames.

10. The mask frame assembly of claim 1, wherein the mask comprises at least one partition mask disposed in a direction so as to cross the opening of the mask frame.

* * * * *